United States Patent
Uno

(10) Patent No.: US 8,004,879 B2
(45) Date of Patent: Aug. 23, 2011

(54) SEMICONDUCTOR MEMORY DEVICE

(75) Inventor: Kazumasa Uno, Yokohama (JP)

(73) Assignee: Renesas Electronics Corporation, Kanagawa (JP)

( * ) Notice: Subject to any disclaimer, the term of this patent is extended or adjusted under 35 U.S.C. 154(b) by 178 days.

(21) Appl. No.: 12/543,913

(22) Filed: Aug. 19, 2009

(65) Prior Publication Data

US 2010/0046281 A1 Feb. 25, 2010

(30) Foreign Application Priority Data

Aug. 20, 2008 (JP) ................................ 2008-211815

(51) Int. Cl.
*G11C 11/00* (2006.01)
(52) U.S. Cl. .................. 365/154; 365/230.05
(58) Field of Classification Search ............ 365/230.05, 365/156, 154
See application file for complete search history.

(56) References Cited

U.S. PATENT DOCUMENTS

| | | | |
|---|---|---|---|
| 6,985,379 B2* | 1/2006 | Nii .............................. | 365/154 |
| 7,440,313 B2* | 10/2008 | Abeln et al. .................. | 365/154 |
| 7,808,812 B2* | 10/2010 | Liu et al. ....................... | 365/156 |
| 2010/0097844 A1* | 4/2010 | Liu .............................. | 365/156 |

FOREIGN PATENT DOCUMENTS

| | | |
|---|---|---|
| JP | 60-247892 A | 12/1985 |
| JP | 2000-339971 A | 12/2000 |

* cited by examiner

*Primary Examiner* — Anh Phung
(74) *Attorney, Agent, or Firm* — Sughrue Mion, PLLC

(57) ABSTRACT

A semiconductor memory device includes a plurality of memory cells 205 provided corresponding to nodes of a plurality of word lines ($WLB_k$, $WLB_{k+1}$) and a plurality of bit line pairs ($D_1$, $DB_1$, $D_{1+1}$, $DB_{1+1}$). And column selection lines ($S1$, $S_{1+1}$) are provided corresponding to each of the bit line pairs. Each of the memory cell includes an inverter (INV3) receiving power from the column selection line, and having its input connected to the word line and its output connected to gates of access transistors. Only the access transistors of a memory cell whose word line and column selection line are simultaneously selected are turned on.

9 Claims, 12 Drawing Sheets

SEMICONDUCTOR MEMORY DEVICE

TECHNICAL FIELD

REFERENCE TO RELATED APPLICATION

This application is based upon and claims the benefit of the priority of Japanese patent application No. 2008-211815, filed on Aug. 20, 2008, the disclosure of which is incorporated herein in its entirety by reference thereto.

The present invention relates to a semiconductor memory device, and particularly to a semiconductor memory device using SRAM cells.

BACKGROUND

In semiconductor integrated circuits of recent years, as the level of integration increases due to miniaturization, the scale of the system mounted on a one-chip semiconductor integrated circuit has increased and so has its operation speed. Further, regarding the application field of semiconductor integrated circuits, markets for mobile telephones, digital cameras, and PDAs are rapidly growing. In the application field of such mobile devices, a power saving ability is a big added value for products. The capacity of semiconductor integrated circuits for memory storage increases every year and the need for power saving technology has become a big issue. Particularly, the reduction of the charge/discharge current of digit lines, which is the main element in the consumption current, has become an important issue in SRAM technology.

FIG. 6 is a complete block diagram of a conventional SRAM semiconductor memory device, described in Patent Document 1, in which the charge/discharge current of digit lines is reduced. The semiconductor memory device in FIG. 6 is constituted by n+1 (bit) memory blocks 100-1 to 100-(n+1). Each memory block is constituted by i+1 columns 0 to i and is accessed by specifying an address using m+1 word lines 0 to m, therefore the device has [(m+1)×(i+1)]word×(n+1)bit (digit) configuration as a whole. Further, corresponding to this configuration, a precharge decoder 101, a word line decoder 102, and a column decoder 103 are provided.

Further, for each memory block, memory cells 105 arranged in (m+1) by (i+1) arrays, a precharge circuit 104 provided for each digit line pair, a column selector 107, a sense amplifier 108, and a write buffer 109 are provided.

Further, one of the characteristics of the configuration in FIG. 6 is that column selection lines (inverted logic) SB[0:i], which are inverted signals of column selection lines (positive logic) S[0:i], are wired to each memory cell 105. The device is configured such that digit line pairs other than selected digit line pairs are not connected to the memory cells 105 because of these column selection lines (inverted logic) SB[0:i].

FIG. 7 is a block diagram showing the internal configuration of the memory cell 105 of the conventional semiconductor memory device shown in FIG. 6. The memory cell 105 is constituted by inverters INV1 and INV2 constituting a latch, access transistors Tr1 and Tr2, and transistors Tr3 and Tr4 that set the gate potential of the access transistors Tr1 and Tr2 to the potential of the word line WL or "Lo" using the column selection line (inverted logic) SB.

Further, the transistor Tr3 is constituted by a P-channel MOS transistor having its gate connected to the column selection line (inverted logic) SB, its source connected to the word line, and its drain connected to gates of the access transistors Tr1 and Tr2. Meanwhile the transistor Tr4 is constituted by a N-channel MOS transistor having its gate connected to the column selection line (inverted logic) SB, its drain connected to the gates of the access transistors Tr1 and Tr2, and its drain grounded.

By configuring the memory cell 105 as described above, when the column selection line (inverted logic) SB is at a low level, the transistor Tr3 is turned on and the transistor Tr4 is turned off. As a result, the gates of the access transistors Tr1 and Tr2 are connected to the word line WL. Meanwhile, when the column selection line (inverted logic) SB is at a high level, the transistor Tr3 is turned off and the transistor Tr4 is turned on. As a result, the gate potentials of the access transistors Tr1 and Tr2 are pulled down to a low level. As described, the column selection line (inverted logic) SB at the high level is connected to the SRAM cell connected to non-selected digit line pair, and readout of held data is not performed on the digit line pair.

FIG. 8 is a timing chart for explaining the operation of the conventional semiconductor memory device shown in FIGS. 6 and 7 for one cycle of an input clock signal CLK. Here, it is assumed that a selected word line and a selected column digit line pair are WL[0] and D [0]/DB [0]. The device operates identically when other word lines and other column digit line pairs are selected. When the clock signal CLK changes from a low level to a high level, a precharge line PC becomes a low level and the precharge of each digit line pair is completed. Further, when the clock signal CLK changes to the high level, the column selection line (positive logic) S[0] and the world line (positive logic) WL[0] go to a high level. When the column selection line (positive logic) S[0] goes to the high level, the column digit line pair D[0]/DB[0] is connected to the sense amplifier 108 and the write buffer 109 via the column selector 107.

Further, because of the fact that the column selection line (positive logic) S[0] goes to the high level, only SB[0] out of the column selection lines (inverted logic) goes to a low level and is fed to the SRAM cell connected to the digit line pair D[0]/DB[0]. Because of this, the transistor Tr3 is turned on and the transistor Tr4 is turned off inside the SRAM cell connected to the word line WL[0] and the digit line pair D[0]/DB[0], and a potential difference corresponding to data held by the latch portion constituted by the inverters INV1 and INV2 occurs only between the digit line pair D[0]/DB[0].

Then, when low-level data is held at a node A of the latch portion, a cell current Id of the memory cell 105 flows from the digit line D to the ground via the transistor Tr1 and the inverter INV2. Meanwhile, when high-level data is held at a node B of the latch portion, a cell current Idb of the memory cell 105 flows from the power supply of the inverter INV1 to the digit line DB via an output terminal of the inverter INV1 and the transistor Tr2.

Further, the other digit line pairs [1:i]/DB[1:i] maintain a digit line potential Vpc, which is approximately the potential at the time of precharging, since data is not read from these line pairs. As a result, a potential difference corresponding to the held data in the digit line pair D[0]/DB[0] occurs only in the SRAM cell connected to the word line WL0 and the column selection line S[0] and is outputted as an output data DOUT[0:n] via the sense amplifier 108.

Then, when the clock signal CLK changes from the high level to the low level, the precharge line PC goes to a high level, and the column selection line S[0] and the word line WL[0] go to a low level. Because of the fact that the precharge line PC goes to the high level, precharging of each digit line pair starts. At this time, the digit line pairs D[0:i]/DB[0:i] are charged so that a potential difference between each digit line pair is equal to each other and is the predetermined digit line precharge potential Vpc. However, since the other digit line pairs D[1:i]/DB[1:i] maintain the digit line precharge potential Vpc, these digit line pairs are hardly charged at the time of precharging. Because of the fact that the column selection line (positive logic) S[0] goes to the low level, the column selection line (inverted logic) SB[0] goes to a high level and is fed to the SRAM cell, along with the other column selection lines (inverted logic) SB[1:i] maintaining the high level. As a result, the transistors Tr3 are turned off and the transistors Tr4 are turned on inside all the memory cells 105, and data is not read from the digit line pairs D[0:i]/DB[0:i].

Further, a technology similar to that of Patent Document 1 is described in Patent Document 2.

[Patent Document 1]
Japanese Patent Kokai Publication No. JP-P2000-339971A
[Patent Document 2]
Japanese Patent Kokai Publication No. JP-A-60-247892

SUMMARY

The entire disclosures of Patent Documents 1 and 2 are incorporated herein by reference thereto.

An analysis of the related art according to the present invention is given as follows.

As described above, the technology described in Patent Document 1, which controls the connection of the word lines to the SRAM cells using the column selection lines, was thought to be able to reduce the charge/discharge current of the digit lines in a semiconductor memory device manufactured in the conventional manufacturing process without any problem.

However, according to an investigation conducted by the present inventors, the technology described in Patent Document 1 cannot effectively deal with miniaturization and low voltage operations in semiconductor manufacturing processes.

In other words, due to the miniaturization and low voltage operations, a leak current from an SRAM cell having its column selection line selected and its word line unselected to the digit line pair during read/write operation cannot be ignored anymore. The reason for this will be explained using a drawing.

FIG. 9 is a drawing for explaining the new problems in the conventional semiconductor memory device described above. Out of the memory cells connected to the selected digit line pair (D, DB), FIG. 9 shows a memory cell 105s connected to a selected word line WLs and a memory cell 105n connected to an unselected word line WLn. There are numerous memory cells connected to the unselected word line WLn, however, the single cell 105n represents these cells in FIG. 9. Since the column selection line (inverted logic) SB that corresponds to the selected digit line pair (D, DB) is at the low level, the transistors (Tr4s and Tr4n) in the memory cell connected to the digit line pair (D, DB) are all turned off. Further, since the unselected word line WLn is at a low level, the ground level of the word line WLn is connected to gates of access transistors Tr1n and Tr2n. However, since the connection is made via a first access transistor-controlling transistor Tr3n constituted by a PMOS transistor, the ground level cannot be delivered and the level is pulled down only to a threshold value Vt of this first access transistor-controlling transistor Tr3. Therefore, the gate potentials of the access transistors Tr1n and Tr2n are the transistor threshold value Vt of the transistor Tr3n.

Here, if the gate potentials (Vt of the PMOS transistor Tr3n) of the access transistors Tr1n and Tr2n of the memory cell 105n, an unselected cell, are below the threshold values of the access transistors Tr1 and Tr2, there will be no interference on the digit line pair (D, DB). Conventionally, the access transistors of the memory cell 105 has had particularly high threshold values in order to maintain static noise margin and the off leak current value has been too small to become an issue.

However, because of a decrease in the transistor threshold value and an increase in the off leak current caused by the decrease in operating voltage due to the miniaturization of transistors in recent years, pulling the level down to the threshold value Vt of the PMOS transistor is not able to turn off the access transistors Tr1 and Tr2, and the data held in the memory cell 105n connected to the selected column line and unselected word line will be transmitted to the digit line pair (D, DB).

In the read operation of the SRAM, according to the data held in the memory cell 105s connected to the selected column and word lines, one of the precharged digit line pair (D, DB) is pulled down to the low level while the other line is maintained at the precharged high level potential. Because of this, a potential difference occurs between the digit line pair (D, DB) and the read operation is performed by amplifying this potential difference using the sense amplifier 108. However, if the data held in the memory cell 105s connected to the selected column and word lines and the data held in the memory cell 105n connected to the selected column line and the unselected word line are different and the connection between the access transistors Tr1n and Tr2n of the unselected cell 105n and the digit line pair (D, DB) is not completely cut off, a sufficient potential difference may not occur between the digit line pair (D, DB) and the sense amplifier 108 may not be able to read accurate data since the unselected cell 105n tries to maintain the digit line (the data line DB in FIG. 9) at the high level meanwhile the selected memory cell 105s attempts to pull down the same digit line to the low level, and the unselected cell 105n tries to pull down the digit line (the data line D in FIG. 9) to the low level meanwhile the selected memory cell 105s attempts to maintains the same digit line at the high level.

In the write operation, according to the data to be written, the write buffer 109 tries to pull down one of the precharged digit line pair (D, DB) to the low level and maintain the other at the precharged high level potential, however, if all the memory cells 105n connected to the selected column line and the unselected word line hold data opposite to the written data and the connection between the access transistors Tr1n and Tr2n and the digit line pair (D, DB) is not completely cut off, write complete time may be delayed and a write error may occur since the unselected cell 105n tries to maintain the digit line at the high level while the write buffer 109 attempts to pull down the same line to the low level and the unselected cell 105n tries to pull down the digit line to the low level while the write buffer 109 attempts to maintain the same line at the high level.

A semiconductor memory device relating to a first aspect of the present invention comprises a plurality of word lines, a plurality of digit line pairs each comprising first and second digit lines, a plurality of memory cells provided in a matrix fashion corresponding to each node of the plurality of word lines and the plurality of digit line pairs, and a plurality of column selection lines provided corresponding to each of the plurality of digit line pairs. Each of the plurality of memory cells comprises a first inverter having an input terminal coupled with a first node and an output terminal coupled with a second node, a second inverter having an input terminal coupled with the second node and an output terminal coupled with the first node, a first access transistor coupled between the first digit line and the first node, a second access transistor coupled between the second digit line and the second node, a first conductivity type first transistor coupled between gates of the first and the second access transistors and the column selection line, and having a gate coupled with the word line, and a second conductivity type first transistor coupled between gates of the first and the second access transistors and a fixed potential, and having a gate coupled with the word line.

A semiconductor memory device relating to a second aspect of the present invention comprises a plurality of word lines; a plurality of digit line pairs each comprising first and second digit lines; a plurality of memory cells provided in a matrix fashion corresponding to each node of the plurality of word lines and the plurality of digit line pairs; and a plurality of column selection lines provided corresponding to each of the plurality of digit line pairs. Each of the plurality of memory cells comprises a first inverter having an input terminal coupled with a first node and an output terminal coupled with a second node; a second inverter having an input terminal coupled with the second node and an output terminal coupled with the first node; a first access transistor coupled between the first digit line and the first node; a second access transistor coupled between the second digit line and the second node; and a third inverter receiving power from the column selection line, and having an input terminal coupled with the word line and an output terminal coupled with gates of the first and the second access transistors.

The meritorious effects of the present invention are summarized as follows.

According to the present invention, since access transistors connected to an unselected word line of a selected column can be turned off completely, the charge/discharge current of an unselected digit line and the leak current from an SRAM cell whose word line is unselected to a digit line pair during read/write operation can be suppressed, and read/write margin can be secured.

BRIEF DESCRIPTIONS OF THE DRAWINGS

PREFERRED MODES OF THE INVENTION

Modes of the present invention will be described with reference to the drawings as necessary.

As shown in FIGS. 1, 2, 4, 5, and 10, a semiconductor memory device in a mode of the present invention includes a plurality of word lines (WL[0:m]), a plurality of digit line pairs (D[0:i], DB[0:i]), each pair comprising first and second digit lines (D, DB), a plurality of memory cells (205, 305) provided in a matrix corresponding to each node of a plurality of word lines (WLB[0:m]) and the plurality of digit line pairs, and a plurality of column selection lines S[0:i] provided corresponding to each of the plurality of digit line pairs (D[0:i], DB[0:i]). And each of the plurality of memory cells (205, 305) includes a first inverter INV1 having a first node A as an input and a second node B as an output, a second inverter INV2 having the second node B as an input and the first node A as an output, a first access transistor Tr1 connected between the first digit line D and the first node A, a second access transistor Tr2 connected between the second digit line DB and the second node B, a first transistor Tr3 of a first conductivity type connected between gates of the first and the second access transistors (Tr1, Tr2) and the column selection line S and having its gate connected to the word line WLB, and a first transistor Tr4 of a second conductivity type connected between the gates of the first and the second access transistors (Tr1 and Tr2) and a fixed potential and having its gate connected to the word line WLB.

In the semiconductor memory device configured as described above, the first transistor Tr3 of the first conductivity type and the first transistor Tr4 of the second conductivity type of the memory cells (205, 305) receive power from the column selection line S and function as complementary inverters having its input connected to the word line WLB and its output connected to the gates of the access transistors (Tr1, Tr2). In other words, when the word line WLB is selected, the first transistor Tr3 of the first conductivity type is turned on and the first transistor Tr4 of the second conductivity type is turned off. Further, when the word line WLB is unselected, the first transistor Tr4 of the second conductivity type is turned on and the first transistor Tr3 of the first conductivity type is turned off.

Further, when the column is selected, power is supplied to the column selection line, and when the column is not selected, no power is supplied to the column selection line. In other words, since the first transistor Tr4 of the second conductivity type is turned on without fail in a memory cell connected to a selected column line and an unselected word line, a potential same as the fixed potential is supplied to the access transistors (Tr1, Tr2) thereby turning the access transistors (Tr1, Tr2) off reliably.

Figure 2:
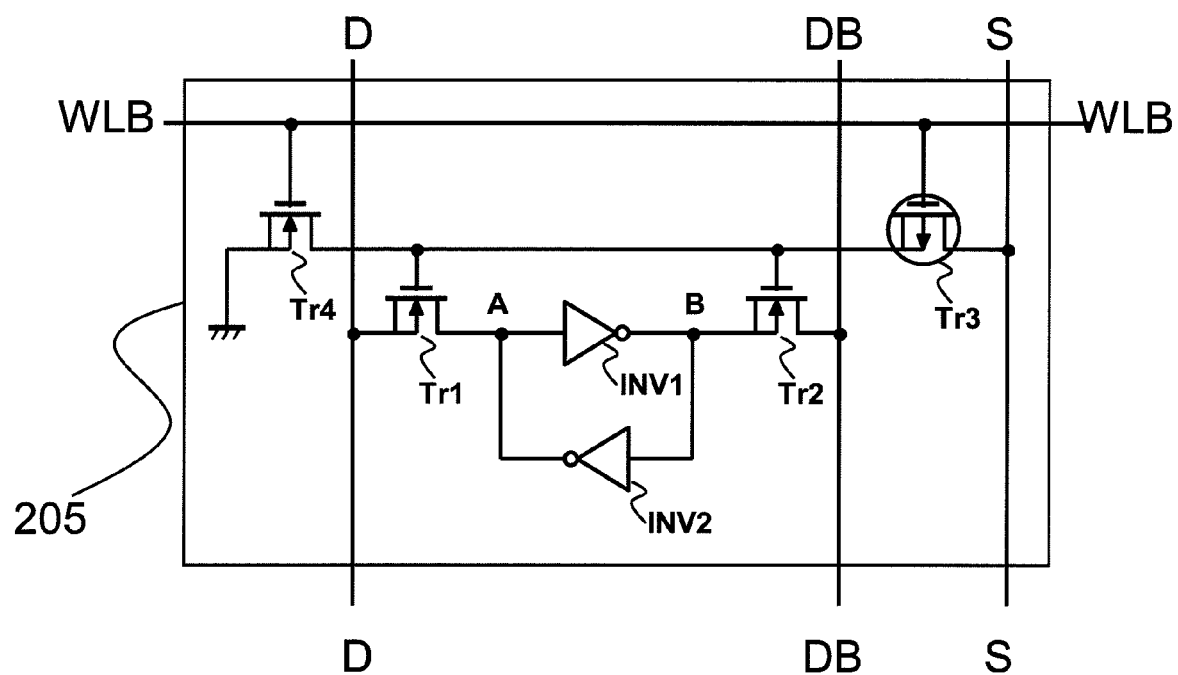
FIG. 2 is a block diagram of a memory cell in the semiconductor memory device according to an example of the present invention.
Figure 5:
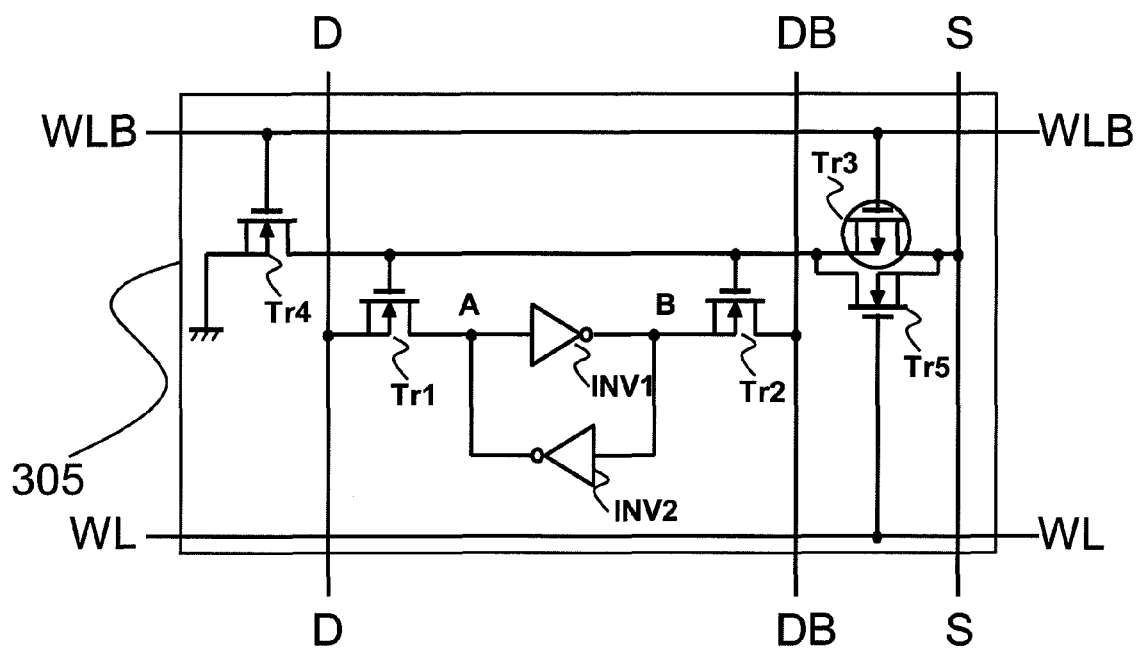
FIG. 5 is a block diagram of a memory cell in the semiconductor memory device according to another example of the present invention.
Figure 10:
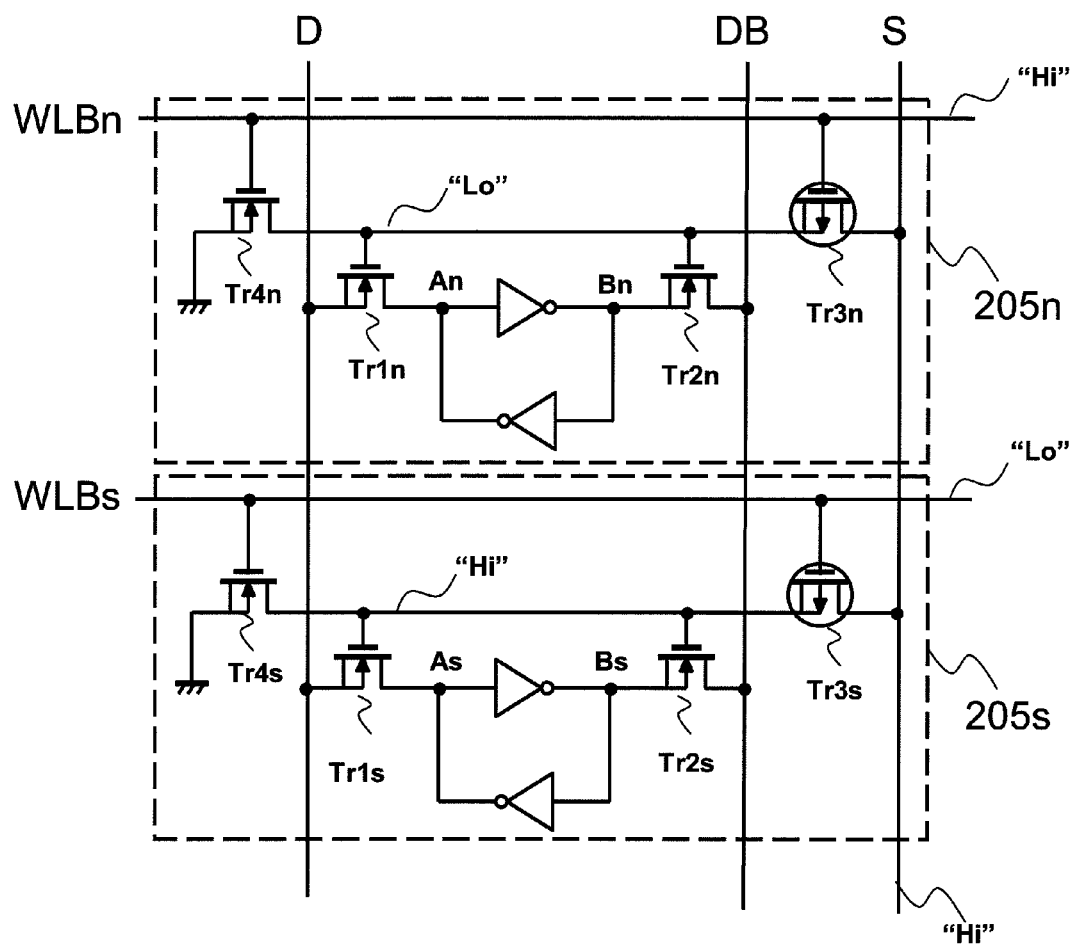
FIG. 10 is a drawing explaining how an example of the present invention solves the problems.

Further, as shown in FIGS. 2, 5, and 10, the first and the second access transistors (Tr1, Tr2) may be transistors of the second conductivity type in a semiconductor memory device in a mode of the present invention. When an access is made, the potential of the selected column selection line is supplied to the gates of the first and the second access transistors (Tr1, Tr2), and when no access is made, a fixed potential is supplied. The transistor of the second conductivity type may be a PMOS transistor or NMOS transistor.

Further, as shown in FIGS. 2, 5, and 10, in a semiconductor memory device in a mode of the present invention, the first transistor Tr3 of the first conductivity type may be a P-channel MOS transistor having its source or drain connected to the gates of the first and the second access transistors (Tr1, Tr2) and the other connected to the column selection line S; the first transistor Tr4 of the second conductivity type may be an N-channel MOS transistor having its drain connected to the gates of the first and the second access transistors (Tr1, Tr2) and its source connected to the fixed potential; the first access transistor Tr1 may be an N-channel MOS transistor having its source or drain (i.e., a first source/drain region) connected to the first digit line D and the other (i.e., a second source/drain region) connected to the first node A; and the second access transistor Tr2 may be an N-channel MOS transistor having its source or drain connected to the second digit line DB and the other connected to the second node B.

In the configuration described above, the fixed potential is a low fixed potential, which serves as the source of the N-channel MOS transistor. Further, in the configuration described above, as in a general CMOS SRAM, NMOS transistors having low resistance may be used as the access transistors.

Further, as shown in FIGS. 1, 2, 4, 5, and 10, in a semiconductor memory device in a mode of the present invention, the plurality of word lines WLB[0:m] may be laid out in a first direction, and the plurality of digit line pairs (D[0:i], DB[0:i]) and the plurality of column selection lines S[0:i] may be laid out in a second direction that crosses with the first direction. By wiring these lines in the directions as described, the memory cells can be easily disposed in a matrix pattern corresponding to each node of the word lines and the digit line pairs.

Figure 4:
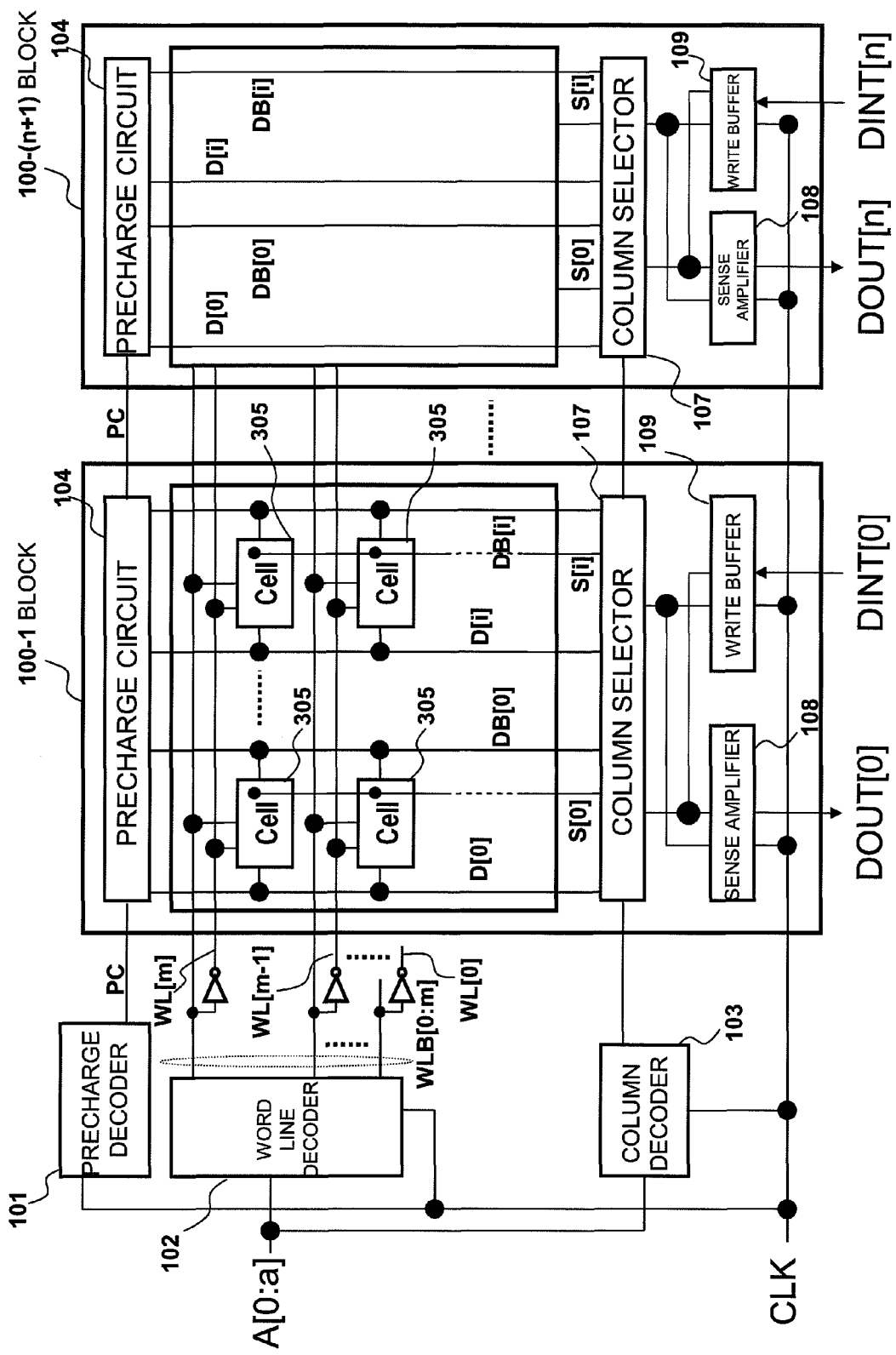
FIG. 4 is a block diagram of a semiconductor memory device according to another example of the present invention.

Further, as shown in FIGS. 4 and 5, in a semiconductor memory device in a mode of the present invention, when each of the plurality of word lines WLB[0:m] is defined as a first word line, a plurality of second word lines WL[0:m], in which the logic of each corresponding first word line WLB is inverted and each of which constitutes a pair with the corresponding first word line WLB, are further provided; and each of the plurality of memory cells 305 may further include a second transistor Tr5 of the second conductivity type connected between the gates of the first and the second access transistors (Tr1, Tr2) and the column selection line S, and having its gate connected to the second word line WL. According to the configuration described above, the access transistor of the memory cell disposed on a node of a selected word line and unselected column line can be turned off completely.

Figure 11:
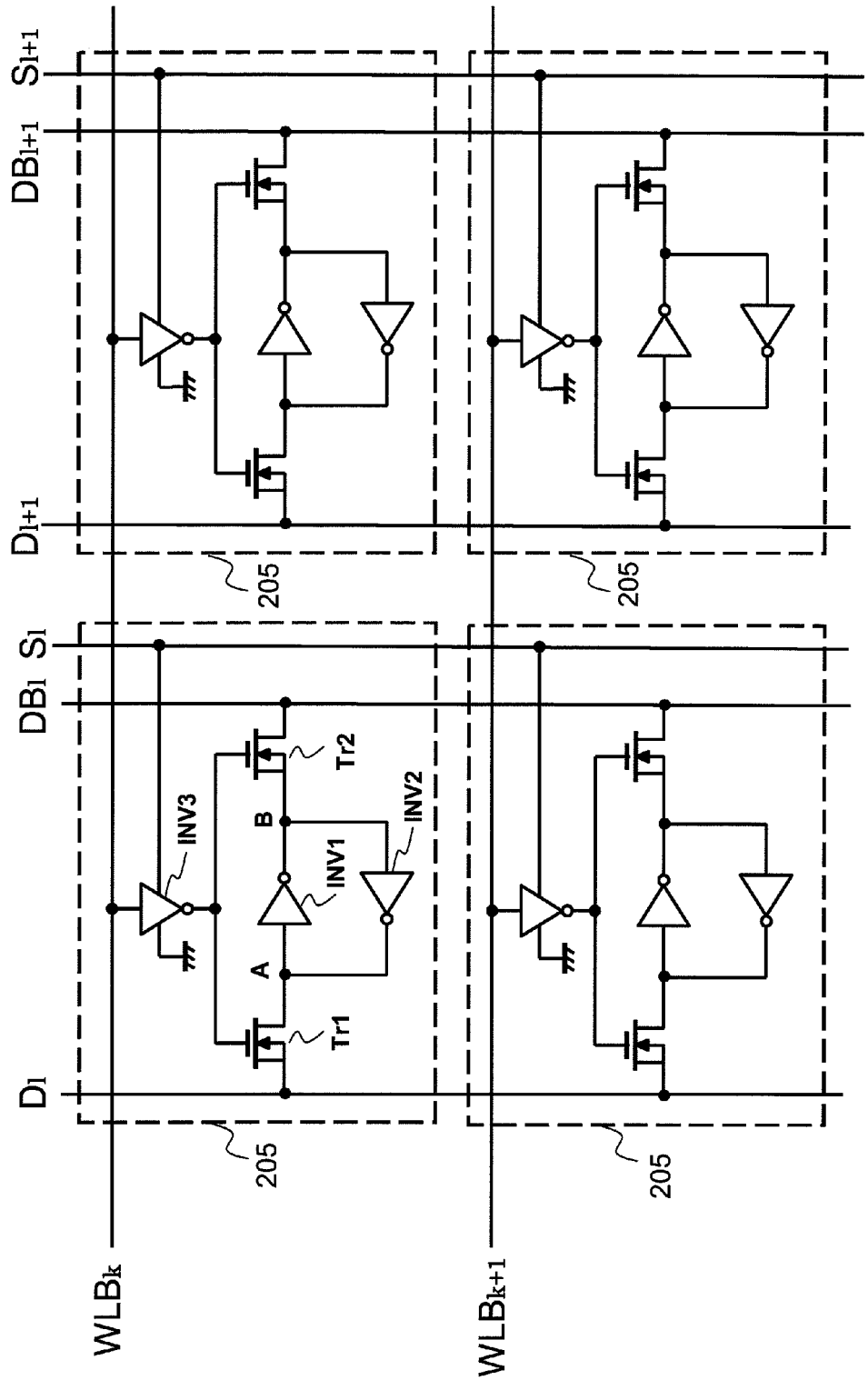
FIG. 11 is another block diagram of the memory cell in the semiconductor memory device according to an example of the present invention.
Figure 12:
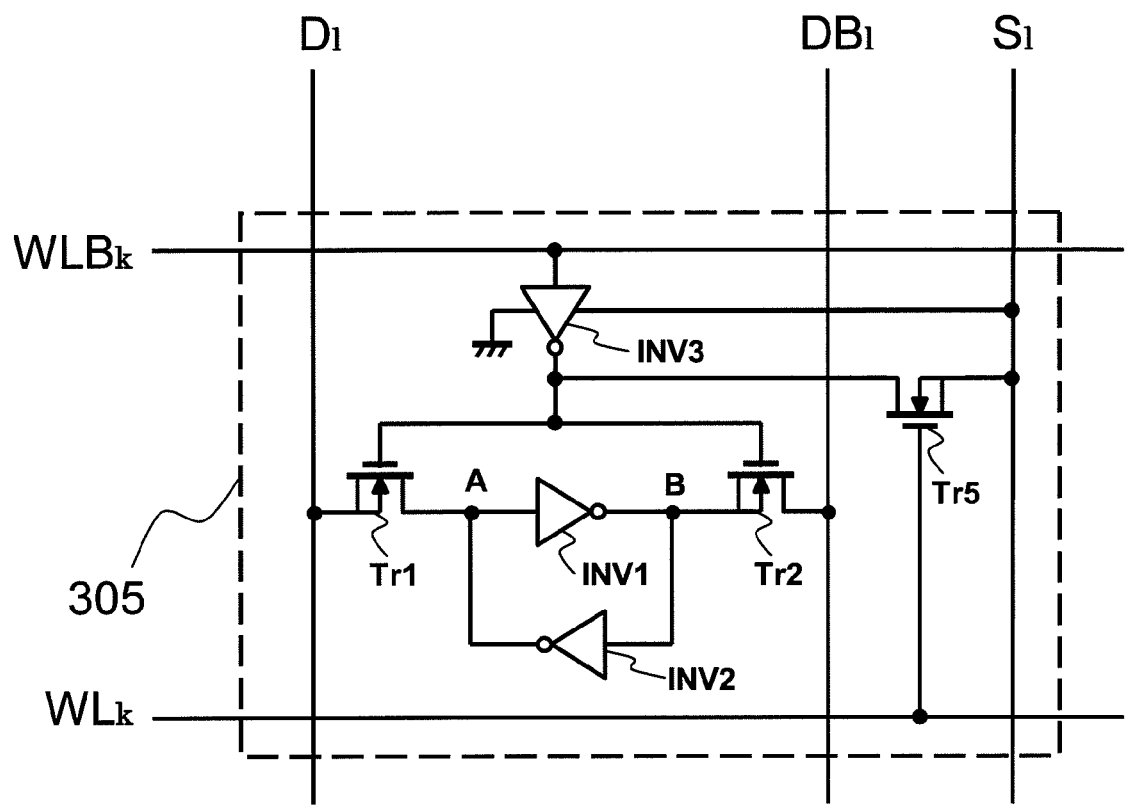
FIG. 12 is another block diagram of the memory cell in the semiconductor memory device according to another example of the present invention.

Further, as shown in FIGS. 11 and 12, a semiconductor memory device in a mode of the present invention may include a plurality of word lines (WLB$_k$, WLB$_{k+1}$), a plurality of digit line pairs (D$_1$, DB$_1$, D$_{1+1}$, DB$_{1+1}$), each pair including first and second digit lines, a plurality of memory cells 205 provided in a matrix corresponding to each node of a plurality of word lines and the plurality of digit line pairs, and a plurality of column selection lines (S1, S$_{1+1}$) provided corresponding to each of the plurality of digit line pairs; and each of the plurality of memory cells 205 may include a first inverter INV1 having a first node as an input and a second node as an output, a second inverter INV2 having the second node as an input and the first node as an output, a first access transistor Tr1 connected between the first digit line D and the first node A, a second access transistor Tr2 connected between the second digit line DB$_1$ and the second node B, and a third inverter INV3 receiving power from the column selection line S$_1$ and having the word line WLB$_k$ connected to its input and its output connected to gates of the first and the second access transistors (Tr1, Tr2).

In other words, in a selected column line, power is supplied to the third inverter from the column selection line, and the level of the word line is inverted and supplied to the gates of the access transistors. As a result, in the selected column line, it is possible to bring only the access transistors of the memory cell connected to the selected word line into a conduction state. On the other hand, since no power is supplied to the third inverter of unselected column selection lines, the access transistors are more or less in an off state.

The present invention will be further described in detail using examples with reference to the drawings.

EXAMPLE 1

Figure 1:
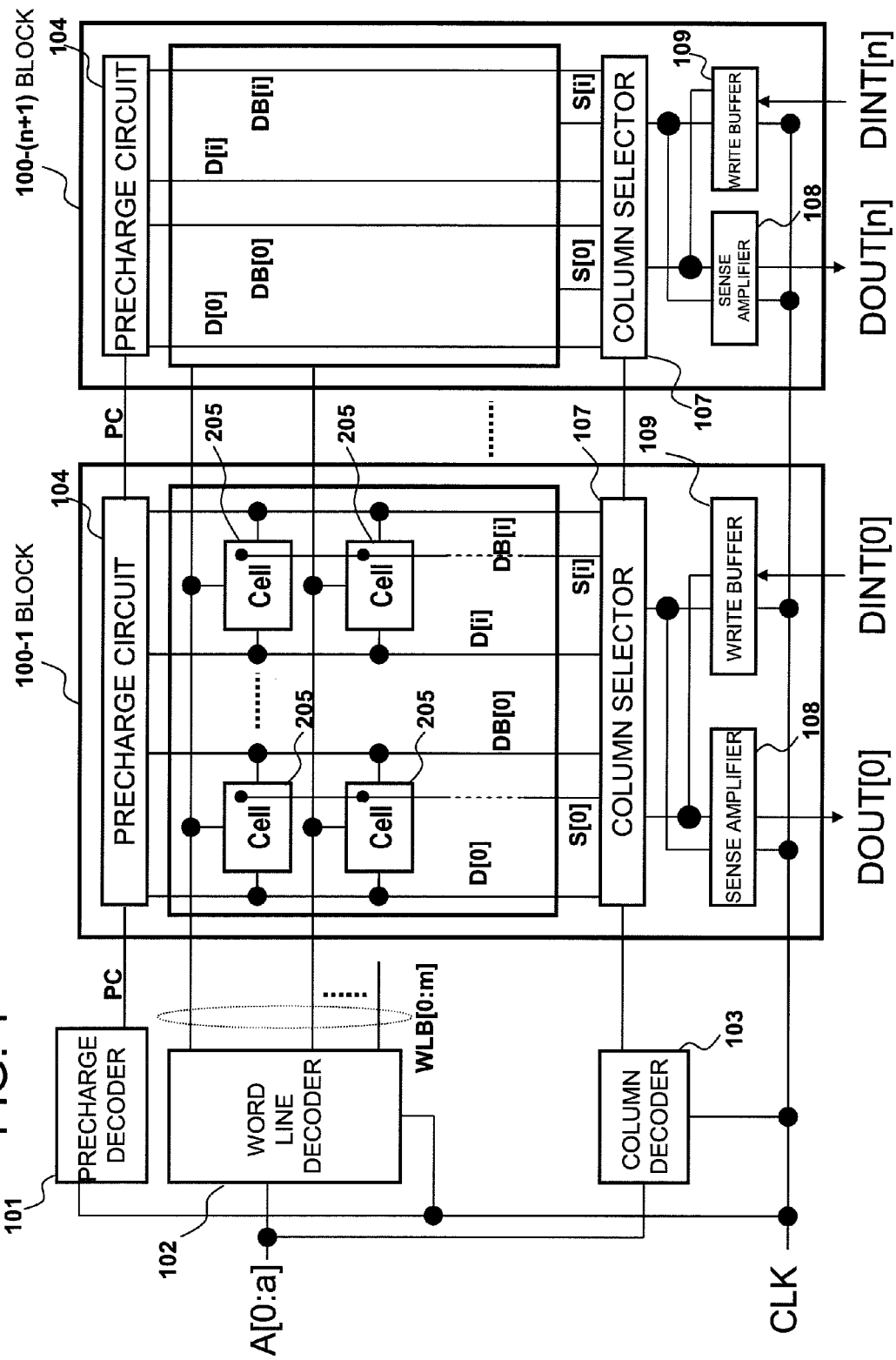
FIG. 1 is a block diagram of a semiconductor memory device according to an example of the present invention.

FIG. 1 is a block diagram of a semiconductor memory device according to Example 1. The semiconductor memory device in FIG. 1 is constituted by n+1 (bit) memory blocks 100-1 to 100-(n+1). Each memory block is constituted by i+1 columns 0 to i and is accessed by specifying an address using m+1 word lines 0 to m, therefore the device has [(m+1)×(i+1)]word×(n+1)bit (digit) configuration as a whole. Further, corresponding to this configuration, a precharge decoder 101, a word line decoder 102, and a column decoder 103 are provided. Further, for each memory block, memory cells 205 arranged in (m+1) by (i+1) arrays, a precharge circuit 104 provided for each digit line pair, a column selector 107, a sense amplifier 108, and a write buffer 109 are provided. Further, column selection lines S[0:i] are connected to the memory cells 205. In this configuration, digit line pairs other than selected digit line pairs are cut off from the memory cells 205 using these column selection lines S[0:i].

FIG. 2 is a block diagram showing the internal configuration of the memory cell 205 shown in FIG. 1. As shown in FIG. 2, the memory cell 205 in Example 1 is constituted by inverters INV1 and INV2 constituting a latch, access transistors Tr1 and Tr2, a first access transistor controlling transistor Tr3 that sets the gate potential of the access transistors Tr1 and Tr2 to the potential of a column selection signal S using the column selection line S, and a pull-down transistor Tr4. Note that the access transistors Tr1 and Tr2 and the pull-down transistor Tr4 are constituted by N-channel MOS transistors and the first access transistor-controlling transistor Tr3 is constituted by a P-channel MOS transistor.

The first access transistor controlling transistor Tr3 includes a gate coupled with an inverting word line WLB[0:m], one of source and drain coupled with the column selection line S[0:i], and the other of source and drain coupled with the gates of the access transistors Tr1 and Tr2. Further, the pull-down transistor Tr4 includes a gate coupled with the word line (inverted logic) WLB, a source grounded, and a drain coupled with the gates of the access transistors Tr1 and Tr2.

In the memory cell 205 configured as above, when the word line (inverted logic) WLB[0:m] is at a low level and the column selection line S[0:i] is at a high level, the first access transistor controlling transistor Tr3 is turned on and the pull-down transistor Tr4 is turned off. As a result, the gate potentials of the access transistors Tr1 and Tr2 become equal to the potential of the column selection line S[0:i]. Meanwhile, when the word line (inverted logic) WLB[0:m] is at a high level, the first access transistor controlling transistor Tr3 is turned off and the pull-down transistor Tr4 is turned on. As a result, the gate potentials of the access transistors Tr1 and Tr2 are pulled down to a low level. As described, in the memory cell 205 connected to an unselected word line, as long as the unselected word line is at the high level, the gates of the access transistors Tr1 and Tr2 are pulled down regardless of the potential of the column selection line, and held data are not read from the digit line pair D[0:i]/DB[0:i].

Figure 3:
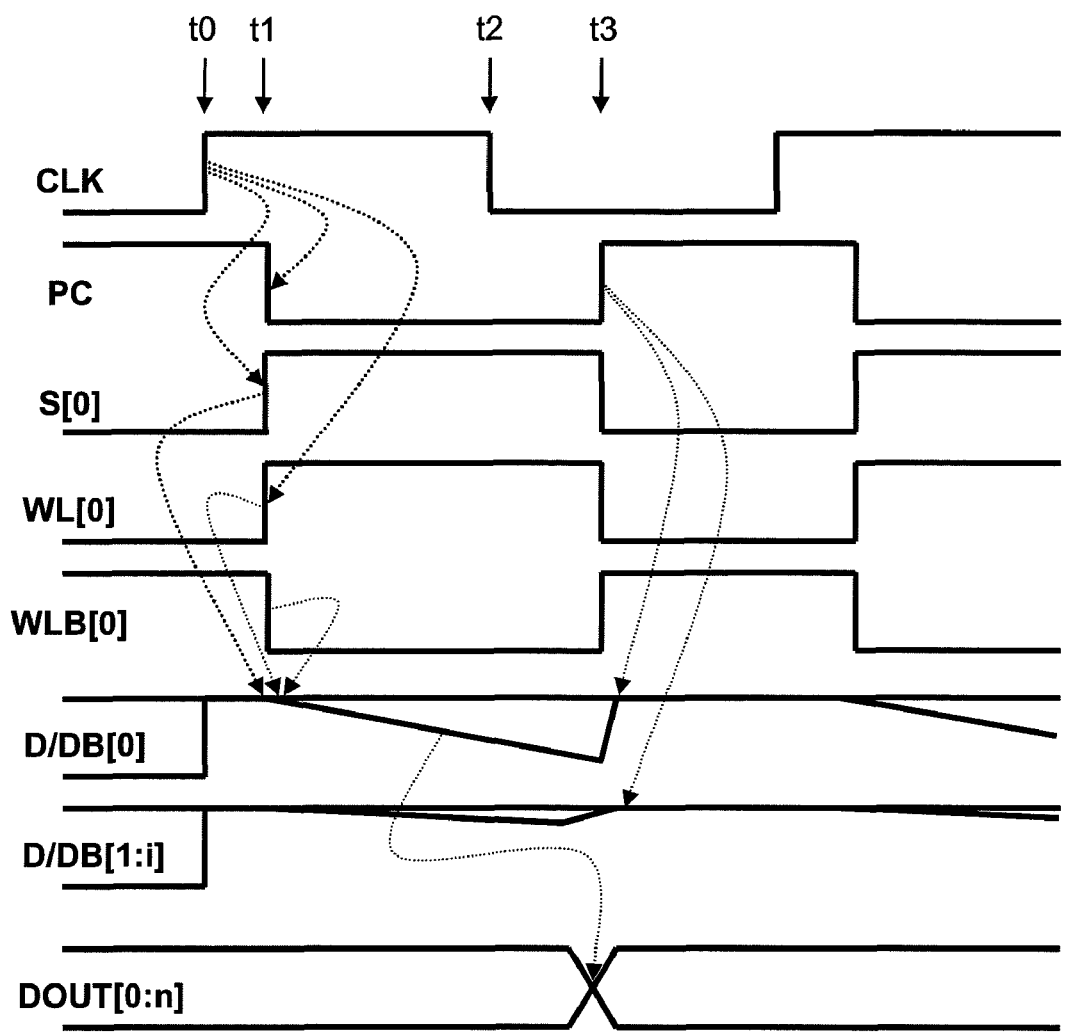
FIG. 3 is a timing chart of the semiconductor memory device according to an example of the present invention.

Next, using a timing chart shown in FIG. 3, the operation of the semiconductor memory device of Example 1 configured as above for one cycle of an input clock signal CLK will be described. In FIG. 3, WLB[0] and D[0]/DB[0] are selected word line (inverted logic) and selected column digit line pair. The operation is the same when other word lines and column digit line pairs are selected.

When the clock signal CLK changes from a low level to a high level at timing t0, a precharge line PC goes to a low level at timing t1. Further, the column selection line S[0] and a word line (positive logic) WL[0] goes to "Hi." Because of the fact that the word line (positive logic) WL[0] goes to the high level, the word line (inverted logic) WLB[0] goes to the low level. Because of the fact that the precharge line PC goes to the low level at the timing t1, precharging of each digit line pair ends. Further, because of the fact that the column selection line S[0] goes to the high level, the column digit line pair D[0]/DB[0] is connected to the sense amplifier 108 and the write buffer 109 via the column selector 107. As a result, in the memory cell 205 connected to the word line (inverted logic) WLB[0] and the digit line pair D[0]/DB[0], the internal first access transistor controlling transistor Tr3 is turned on, the pull-down transistor Tr4 is turned off, and a potential difference corresponding to data held in the latch portion constituted by the inverters INV1 and INV2 occurs only between the digit line pair D[0]/DB[0] since the column selection line S[0] connected to the first access transistor controlling transistor Tr3 is at the high level.

Then, when low-level data is held at a node A of the latch portion, a cell current Id of the memory cell 205 flows to the ground via on-resistances of the access transistor Tr1 and the inverter INV2. Meanwhile, when high-level data is held at a node B of the latch portion, a cell current Idb of the memory cell 205 flows via an on-resistance between the power supply and an output terminal of INV2 and an on-resistance of the access transistor Tr2. Further, other digit line pairs D[1:i]/DB[1:i] maintain a digit line potential Vpc, which is approximately the potential at the time of precharging, since data is not read from these line pairs. As a result, a potential difference corresponding to the held data in the digit line pair D[0]/DB[0] occurs only in the memory cell 205 connected to both the inverting word line WLB[0] and the column selection signal line S[0] and is outputted as an output data DOUT[0:n] via the sense amplifier 108.

Then, when the clock signal CLK changes from the high level to the low level at timing t2, the precharge line PC goes to a high level, the column selection line S[0] and the word line (positive logic) WL[0] go to a low level, and the word line (inverted logic) WLB[0] goes to the high level at timing t3. Because of the fact that the precharge line PC goes to the high level, precharging of each digit line pair starts. At this time, the digit line pairs D[0:i]/DB[0:i] are charged so that there is no potential difference between each digit line pair and the potential is a predetermined digit line precharge potential Vpc. However, since the other digit line pairs D[1:i]/DB[1:i] maintain the digit line precharge potential Vpc, these digit line pairs are hardly charged at the time of precharging and almost no charge current flows.

Next, how Example 1 solves the problems will be explained using FIG. 10, contrasted with FIG. 9 used to explain the problem. Out of memory cells connected to a selected digit line pair (D, DB), FIG. 10 shows a memory cell 205s connected to a selected word line (inverted logic) WLBs and a memory cell 205n connected to an unselected word line WLBn. There are numerous memory cells connected to the unselected word line WLBn, however, the single cell 205n represents these cells in FIG. 10. Since the column selection line S corresponding to the selected digit line pair (D, DB) is at the high level, a high-level power source is supplied to the sources or drains of the first access transistor controlling transistors (Tr3n, Tr3s) of the memory cells connected to the digit line pair (D, DB). Here, the selected word line WLBs is at the low level, a high level voltage is supplied to the unselected word line WLBn.

Therefore, in the selected memory cell 205s, the NMOS transistor Tr4 is turned off, the PMOS transistor Tr3 is turned on, and a high level voltage is supplied to the gates of the access transistors Tr1s and Tr2s via the column selection line S. Meanwhile, in the unselected memory cell 205n, the NMOS transistor Tr4n is turned on, the PMOS transistor Tr3n is turned off, and a ground level (low level) voltage is supplied to the gates of the access transistors Tr1n and Tr2n via the NMOS transistor Tr4n.

Figure 9:
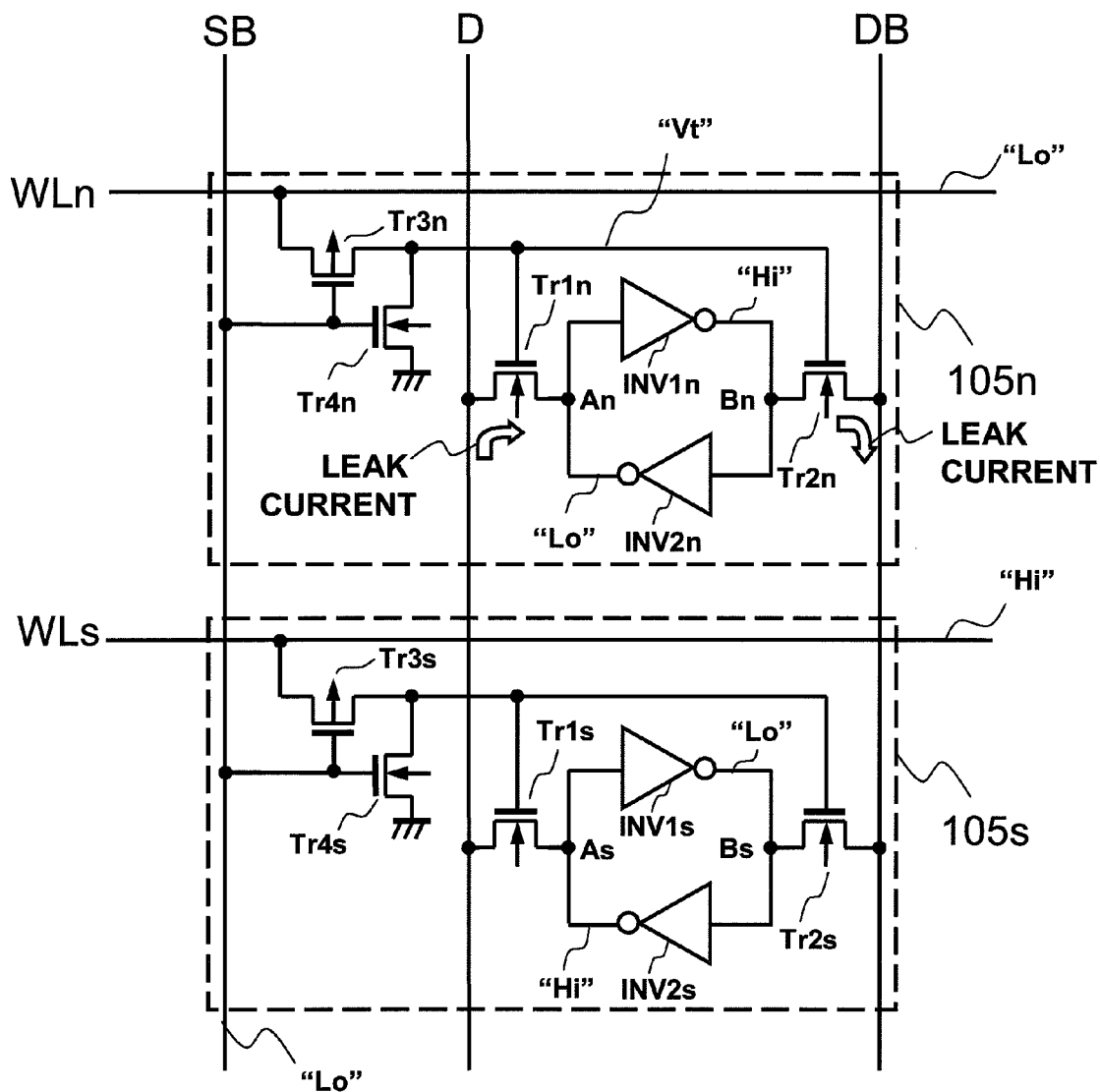
FIG. 9 is a drawing for explaining problems in the conventional semiconductor memory device.

In other words, since the low level voltage is supplied to the gates of the access transistors of the memory cell connected to the unselected word line of the selected column via the NMOS transistor Tr4n, instead of the PMOS transistor in FIG. 9, the potential will not increase to the threshold value (Vt) unlike the case shown in FIG. 9. As a result, the access transistors of the memory cell connected to the unselected word line of the selected column are cut off completely.

Further, in a memory cell connected to an unselected word line of an unselected column, since the word line (inverted logic) WLB goes to the high level and the NMOS transistor Tr4 is in an on state completely, a low level voltage can be sufficiently supplied to the access transistors, thereby cutting them off.

Meanwhile, in a memory cell connected to a selected word line of an unselected column, the NMOS transistor Tr4 is in an off state, and a low level voltage is supplied to the gates of the access transistors via the PMOS transistor Tr3. In this case, a potential that has increased by as much as the threshold value (Vt) is supplied to the gates of the access transistors, instead of a perfect low level voltage, as in the case in FIG. 9. However, the access transistors of the cells connected to the other unselected word lines can be cut off completely in the unselected columns. Therefore, the operation failure described in FIG. 9 does not occur.

Further, considering the fact that a high level voltage is supplied to the gates of the access transistors completely in a memory cell connected to a selected word line of an unselected column in the SRAM (for instance, refer to FIG. 6 of Patent Document 1) in which the conventional and general word line is directly connected to the gates of the access transistors, the current consumption of the unselected digit lines can be reduced greatly since the low level voltage, albeit imperfect, is supplied to the gates of the access transistors via the PMOS transistor Tr3.

FIG. 11 is a block diagram showing a different perspective on the memory cell of Example 1. FIG. 11 shows four memory cells connected to word lines $WLB_k$ and $WLB_{k+1}$, and digit line pairs $(D_1, DB_1)$ and $(D_{1+1}, DB_{1+1})$. In FIG. 11, the first access transistor controlling transistor Tr3 and the pull-down transistor Tr4 in FIG. 2 are shown as an inverter INV3 receiving power from the column selection line S and having its input connected to the word line (inverted logic) WLB and its output connected to the access transistors Tr1 and Tr2. In other words, since power is supplied to the inverter INV3 of a memory cell connected to a selected column selection line from the column selection line and an unselected word line (inverted logic) WLB goes to the high level, a low level voltage is applied to the gates of the access transistors Tr1 and Tr2, and the access transistors are turned off, cutting the memory cell off from the digit line. Meanwhile, since a selected word line (inverted logic) WLB goes to the low level, a high level voltage is applied to the gates of the access transistors Tr1 and Tr2, and the access transistors are turned on, connecting the memory cell to the digit line.

On the other hand, since an unselected column selection line is at the low level, no power is supplied to the inverter INV3 and the access transistors are not turned on. In other words, as long as the inverter INV3 is a circuit that functions as a logic inverting element, the configuration of the internal circuit may be different from FIG. 2.

EXAMPLE 2

FIG. 4 is a complete block circuit diagram showing a semiconductor memory device according to Example 2 of the present invention. In Example 2, portions configured identically to Example 1 are given the same symbols as those in the drawings of Example 1, and detailed explanations will be omitted. Compared with FIG. 1 of Example 1, FIG. 4 differs from FIG. 1 in that the word lines (positive logic) WL [0:m] are wired in the memory blocks (100-1 to 100-(n+1)), in addition to the word lines (inverted logic) WLB[0:m]. Otherwise, FIG. 4 is almost the same as FIG. 1 of Example 1.

FIG. 5 is a block diagram showing the configuration of the memory cell 305 shown in FIG. 4. Compared with the memory cell in FIG. 2 of Example 1, the memory cell 305 differs from the memory cell 205 in that a second access transistor controlling transistor Tr5 having its gate connected to the word line (positive logic) WL[0:m], its source or drain connected to the column selection line S[0:i], and the other connected to the gates of the access transistors Tr1 and Tr2 is added between the column selection line S[0:i] and the gates of the access transistors Tr1 and Tr2 in parallel with the first access transistor controlling transistor Tr3. Otherwise, the memory cell 305 is configured almost identically to the memory cell in FIG. 2 of Example 1. The second access transistor controlling transistor Tr5 is constituted by an N-channel MOS transistor.

In Example 2, since the gates of the access transistors Tr1 and Tr2 and the column selection line S[0:i] are connected by the transistor Tr5, which is an NMOS transistor, and the transistor Tr3, which is a PMOS transistor, in parallel, the low level voltage of the column line is reliably delivered to the gates of the access transistors Tr1 and Tr2 by the NMOS transistor Tr5 when the word line is selected and the column line is unselected. As a result, the access transistors Tr1 and Tr2 of a memory cell connected to an unselected column line and a selected word line can be cut off more reliably than Example 1.

As in Example 1, the first access transistor controlling transistor Tr3 and the pull-down transistor Tr4 can be thought as the inverter INV3 receiving power from the column selection line S and having its input connected to the word line (inverted logic) WLB and its output connected to the access transistors Tr1 and Tr2 in Example 2 as shown in FIG. 12. The basic operation is the same as described using FIG. 11, however, the gates of the access transistors of a memory cell connected to an unselected column line and a selected word line are pulled down to the low level by the NMOS transistor Tr5 more reliably.

Figure 6:
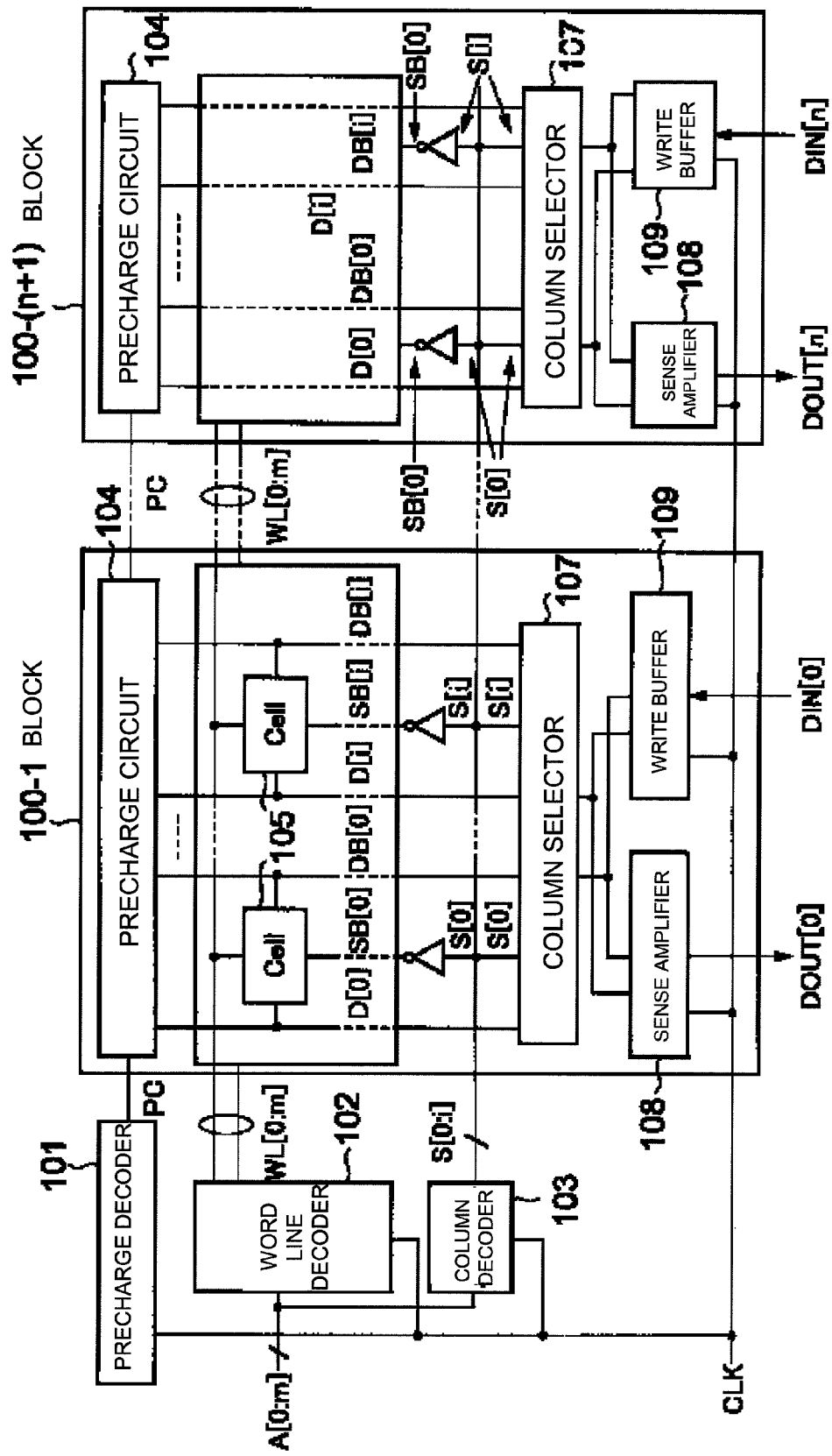
FIG. 6 is a block diagram of a conventional semiconductor memory device.
Figure 7:
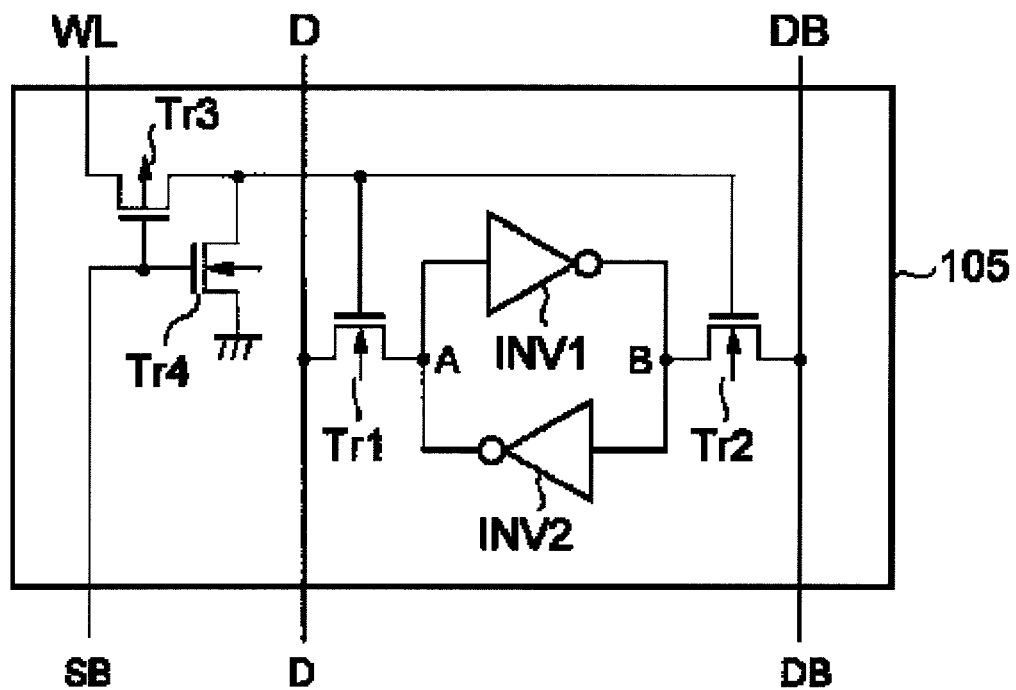
FIG. 7 is a block diagram of a memory cell in the conventional semiconductor memory device.
Figure 8:
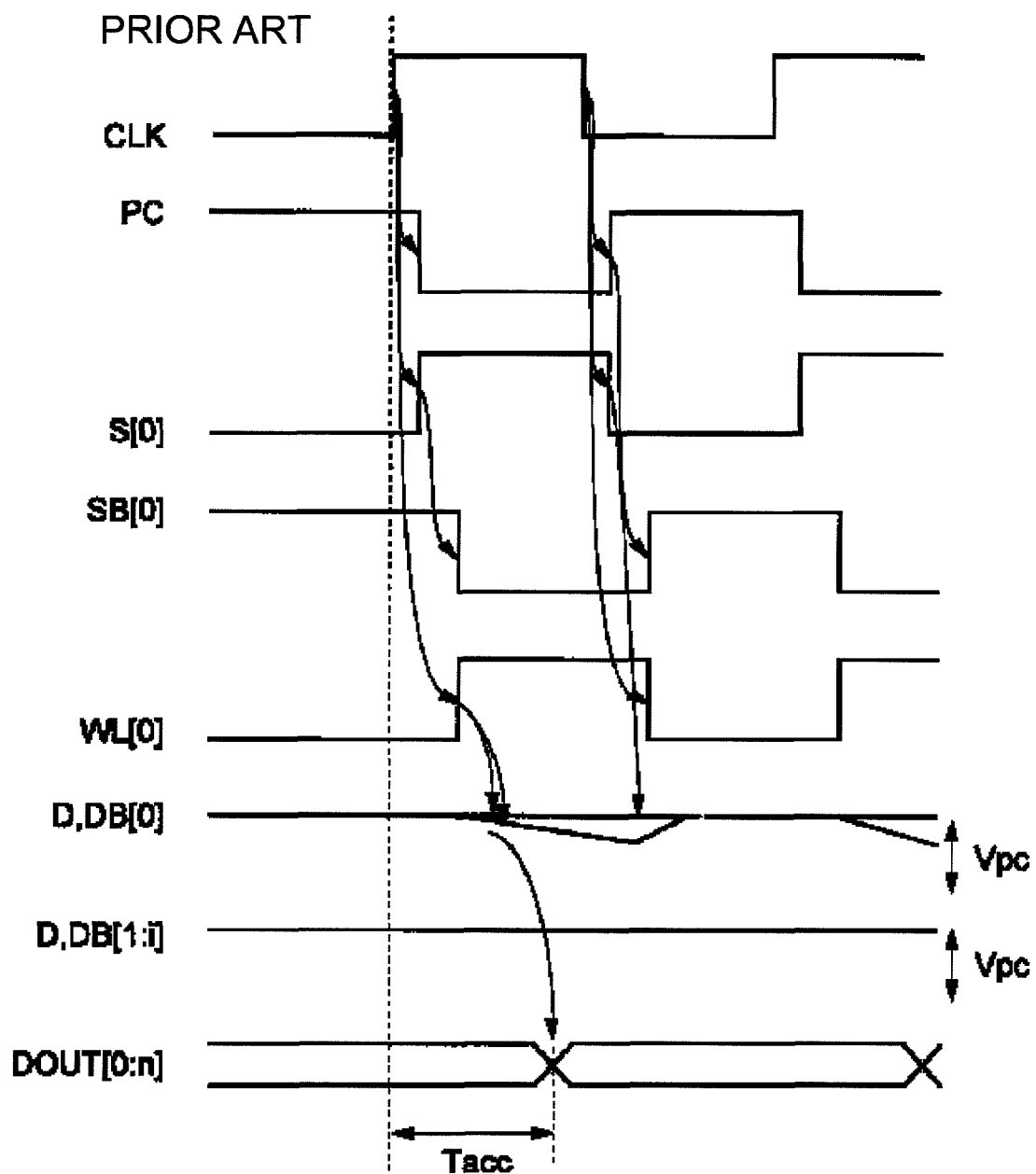
FIG. 8 is a timing chart of the conventional semiconductor memory device.

The effects of Examples 1 and 2 over the conventional technology shown in FIGS. 6 and 7 are summarized below. In Table 1, the current values during read operation are compared between the conventional example shown in FIGS. 6 and 7 and Examples of the present invention. The memory cell current capability is Icell, and the leak current of an unselected memory cell is Idis. Further, the number of interfering SRAM cells indicates the number of SRAM cells that are in the same column as the selected cell, the read target, and that hold data opposite to that of the selected cell.

TABLE 1

| | SRAM cell effective current value | Note |
|---|---|---|
| Conventional Technology | Icell-(Idis × n) | n is the number of interfering SRAM cells. |
| Present Invention | Icell | — |

As shown in Table 1, in the conventional technology, the more the number of interfering SRAM cells increases, the more the cell effective current value during read operation decreases. A small cell effective current value makes it difficult for a potential difference to occur between a digit line pair. As a result, read complete time may be delayed, or a read error may occur because a sufficient potential difference does not occur between the digit line pair and the sense amplifier may perform erroneous sensing operation. In the conventional technology, no matter how large the memory cell current capability Icell is, there is a possibility that a read error may occur, depending on the size of the unselected cell leak current Idis and the number of interfering SRAM cells.

However, according to Examples 1 and 2 of the present invention, since the leak current Idis of the unselected cells caused by the design in the conventional technology is eliminated, the deterioration of read characteristics such as the read operation delay and read errors caused by Idis and the interfering SRAM cells does not occur.

Further, in Table 2, the operating current values during write operation are compared between the conventional example shown in FIGS. 6 and 7 and Examples of the present invention. The write buffer current capability is Iwa. The number of interfering SRAM cells during write operation indicates the number of SRAM cells that are in the same column as the selected cell, the write target, and that hold data opposite to the output of the write buffer.

TABLE 2

| | Write buffer effective current value | Note |
|---|---|---|
| Conventional Technology | Iwa-Icell-(Idis × n) | n is the number of interfering SRAM cells. |
| Present invention | Iwa-Icell | |

As shown in Table 2, in the conventional technology, the more the number of interfering SRAM cells increases, the more the write buffer effective current value during write operation decreases. A small write buffer effective current value makes it difficult to apply a potential difference to a digit line pair. As a result, write complete time may be delayed, or a write error may occur because a sufficient potential difference does not occur between the digit line pair. In the conventional technology, no matter how large Iwa is, the deterioration of write characteristics such as write errors is an issue, depending on the size of Idis and the number of interfering SRAM cells.

However, according to Examples 1 and 2, since the leak current Idis of the unselected cells caused by the design in the conventional technology is eliminated, the deterioration of write characteristics such as the write operation delay and write errors caused by Idis and the interfering SRAM cells does not occur.

Note that NMOS transistors are used as the access transistors of the memory cells in Examples 1 and 2, however, the access transistors are not limited to NMOS transistors. For instance, PMOS transistors may be used as the access transistors. In such a case, the conductivity type of all the transistors are reversed; the fixed potential is set to a high potential voltage; the column line connected to a selected memory cell is driven to the low level; the word line to the high level; the column line connected to an unselected memory cell is driven to the high level; and the word line to the low level.

In the present invention, the following modes are possible.
(Mode 1): as mentioned as the first aspect.
(Mode 2):
Each of the first and the second access transistors may be a second conductivity type transistor.
(Mode 3):
The first conductivity type first transistor may be a P-channel MOS transistor having a first source/drain region coupled with the gates of the first and the second access transistors and a second source/drain region coupled with the column selection line. The second conductivity type first transistor may be an N-channel MOS transistor having a drain coupled with the gates of the first and the second access transistors and a source coupled with the fixed potential. The first access transistor may be an N-channel MOS transistor having a first source/drain region coupled with the first digit line and a second source/drain region coupled with the first node. And the second access transistor may be an N-channel MOS transistor having a first source/drain region coupled with the second digit line and a second source/drain region coupled with the second node.
(Mode 4):
The plurality of word lines may be laid out in a first direction, and the plurality of digit line pairs and the plurality of column selection lines may be laid out in a second direction that crosses with the first direction.
(Mode 5):
When each of the plurality of word lines is defined as a first word line, the semiconductor memory may further comprise a plurality of second word lines each of which constitutes a pair with one of the plurality of first word lines. The pair of first word line and second word line has complementary logic level. And each of the plurality of memory cells may further include a second conductivity type second transistor coupled between gates of the first and the second access transistors and the column selection line, and having a gate coupled with the second word line.
(Mode 6):
The second conductivity type second transistor may be an N-channel MOS transistor having a first source/drain region coupled with gates of the first and the second access transistors and a second source/drain region coupled with the corresponding column selection line.
(Mode 7):
The plurality of first and second word lines may be laid out in a first direction, and the plurality of digit line pairs and the plurality of column selection lines may be laid out in a second direction that crosses with the first direction.
(Mode 8): as mentioned as the second aspect.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor memory device comprising:
a plurality of word lines;
a plurality of digit line pairs each comprising first and second digit lines;
a plurality of memory cells provided in a matrix fashion corresponding to each node of said plurality of word lines and said plurality of digit line pairs; and
a plurality of column selection lines provided corresponding to each of said plurality of digit line pairs; wherein each of said plurality of memory cells comprises:
a first inverter having an input terminal coupled with a first node and an output terminal coupled with a second node;
a second inverter having an input terminal coupled with said second node and output terminal coupled with said first node;
a first access transistor coupled between said first digit line and said first node;
a second access transistor coupled between said second digit line and said second node;
a first conductivity type first transistor coupled between gates of said first and said second access transistors and said column selection line, and having a gate coupled with said word line; and
a second conductivity type first transistor coupled between gates of said first and said second access transistors and a fixed potential, and having a gate coupled with said word line.

2. The semiconductor memory device as defined in claim 1 wherein each of said first and said second access transistors is a second conductivity type transistor.

3. The semiconductor memory device as defined in claim 1, wherein
said first conductivity type first transistor is a P-channel MOS transistor having a first source/drain region coupled with gates of said first and said second access transistors and a second source/drain region coupled with said column selection line;
said second conductivity type first transistor is an N-channel MOS transistor having a drain coupled with gates of said first and said second access transistors and a source coupled with said fixed potential;
said first access transistor is an N-channel MOS transistor having a first source/drain region coupled with said first digit line and a second source/drain region coupled with said first node; and
said second access transistor is an N-channel MOS transistor having a first source/drain region coupled with said second digit line and a second source/drain region coupled with said second node.

4. The semiconductor memory device as defined in claim 1, wherein said plurality of word lines are laid out in a first direction, and said plurality of digit line pairs and said plurality of column selection lines are laid out in a second direction that crosses with said first direction.

5. The semiconductor memory device as defined in claim 1, when each of said plurality of word lines is defined as a first word line, further comprising:
a plurality of second word lines each of which constitutes a pair with one of said plurality of first word lines, said pair having complementary logic level; and
wherein each of said plurality of memory cells further comprises a second conductivity type second transistor coupled between gates of said first and said second access transistors and said column selection line, and having a gate coupled with said second word line.

6. The semiconductor memory device as defined in claim 5, wherein said second conductivity type second transistor is an N-channel MOS transistor having a first source/drain region coupled with gates of said first and said second access transistors and a second source/drain region coupled with said corresponding column selection line.

7. The semiconductor memory device as defined in claim 5, wherein said plurality of first and second word lines are laid out in a first direction, and said plurality of digit line pairs and said plurality of column selection lines are laid out in a second direction that crosses with said first direction.

8. A semiconductor memory device comprising:
   a plurality of word lines;
   a plurality of digit line pairs each comprising first and second digit lines;
   a plurality of memory cells provided in a matrix fashion corresponding to each node of said plurality of word lines and said plurality of digit line pairs; and
   a plurality of column selection lines provided corresponding to each of said plurality of digit line pairs; wherein each of said plurality of memory cells comprises:
   a first inverter having an input terminal coupled with a first node and an output terminal coupled with a second node;
   a second inverter having an input terminal coupled with said second node and an output terminal coupled with said first node;
   a first access transistor coupled between said first digit line and said first node;
   a second access transistor coupled between said second digit line and said second node; and
   a third inverter receiving power from said column selection line, and having an input terminal coupled with said word line and an output terminal coupled with gates of said first and said second access transistors.

9. The semiconductor memory device as defined in claim 8, when each of said plurality of word lines is defined as a first word line, further comprising:
   a plurality of second word lines each of which constitutes a pair with one of said plurality of first word lines, said pair having complementary logic level; and
   wherein each of said plurality of memory cells further comprises a transistor coupled between gates of said first and said second access transistors and said column selection line, and having a gate coupled with said second word line, said transistor having a same conductivity type with said first and said second access transistors.

* * * * *